United States Patent
Lee et al.

(10) Patent No.: US 10,615,227 B2
(45) Date of Patent: Apr. 7, 2020

(54) SPHERICAL COMPLEMENTARY RESISTANCE SWITCHABLE FILLER AND NONVOLATILE COMPLEMENTARY RESISTANCE SWITCHABLE MEMORY COMPRISING THE SAME

(71) Applicant: KOREA INSTITUTE OF SCIENCE AND TECHNOLOGY, Seoul (KR)

(72) Inventors: Sang-Soo Lee, Seoul (KR); Jong Hyuk Park, Seoul (KR); Jeong Gon Son, Seoul (KR); Minsung Kim, Seoul (KR); Young Jin Kim, Seoul (KR); Heesuk Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 15/817,644

(22) Filed: Nov. 20, 2017

(65) Prior Publication Data

US 2019/0035853 A1 Jan. 31, 2019

(30) Foreign Application Priority Data

Jul. 25, 2017 (KR) .................. 10-2017-0093949

(51) Int. Cl.
*G11C 11/00* (2006.01)
*H01L 27/24* (2006.01)
(Continued)

(52) U.S. Cl.
CPC ...... *H01L 27/2481* (2013.01); *G11C 13/0007* (2013.01); *G11C 13/0016* (2013.01);
(Continued)

(58) Field of Classification Search
CPC ............. H01L 45/1233; H01L 45/1253; H01L 45/145; H01L 27/2481; G11C 13/0069; G11C 2213/71
See application file for complete search history.

(56) References Cited

U.S. PATENT DOCUMENTS

| 2009/0095950 A1* | 4/2009 | Lieber ................... B82Y 10/00 |
| | | 257/4 |
| 2010/0081268 A1* | 4/2010 | Schricker .............. H01L 27/101 |
| | | 438/600 |

(Continued)

FOREIGN PATENT DOCUMENTS

| KR | 10-2012-0107304 A | 10/2012 |
| KR | 10-1416243 B1 | 7/2014 |

(Continued)

*Primary Examiner* — Uyen B Tran
(74) *Attorney, Agent, or Firm* — Rabin & Berdo, P.C.

(57) ABSTRACT

A resistance-switchable material containing: an insulating support; and a complementary resistance switchable filler dispersed in the insulating support, wherein the complementary resistance switchable filler has a spherical core-shell structure containing: a spherical conductive core containing a conductive material; and an insulating shell formed on the surface of the core and containing an insulating material. The resistance-switchable material is capable of exhibiting complementary resistive switching characteristics with improved reliability and stability as symmetrical uniform filament current paths are formed in respective resistive layers adjacent to two electrodes with the conductive core of the complementary resistance-switchable filler at the center due to the electric field control effect by the spherical complementary resistance-switchable filler.

2 Claims, 6 Drawing Sheets

(51) Int. Cl.
*G11C 13/00* (2006.01)
*H01L 45/00* (2006.01)

(52) U.S. Cl.
CPC ........ *G11C 13/0069* (2013.01); *H01L 45/085* (2013.01); *H01L 45/1233* (2013.01); *H01L 45/1246* (2013.01); *H01L 45/1253* (2013.01); *H01L 45/141* (2013.01); *H01L 45/145* (2013.01); *H01L 45/1608* (2013.01); *G11C 2213/18* (2013.01); *G11C 2213/35* (2013.01); *G11C 2213/52* (2013.01); *G11C 2213/71* (2013.01)

(56) References Cited

U.S. PATENT DOCUMENTS

| | | | | |
|---|---|---|---|---|
| 2010/0279426 | A1* | 11/2010 | Tour | B82Y 10/00 |
| | | | | 436/149 |
| 2012/0241706 | A1* | 9/2012 | Lee | H01B 1/22 |
| | | | | 257/2 |
| 2015/0221700 | A1* | 8/2015 | Cho | G11C 11/5678 |
| | | | | 365/148 |
| 2018/0033518 | A1* | 2/2018 | Ota | C08J 9/26 |
| 2018/0212147 | A1* | 7/2018 | Ruiz | H01L 45/06 |

FOREIGN PATENT DOCUMENTS

| | | |
|---|---|---|
| KR | 10-1460100 B1 | 11/2014 |
| KR | 10-1531154 B1 | 6/2015 |
| KR | 10-2016-0049574 A | 5/2016 |

\* cited by examiner

SPHERICAL COMPLEMENTARY RESISTANCE SWITCHABLE FILLER AND NONVOLATILE COMPLEMENTARY RESISTANCE SWITCHABLE MEMORY COMPRISING THE SAME

CROSS-REFERENCE TO RELATED APPLICATIONS

This application claims, under 35 U.S.C. § 119, the priority of Korean Patent Application No. 10-2017-0093949 filed on Jul. 25, 2017 in the Korean Intellectual Property Office, the disclosure of which is incorporated herein by reference in its entirety.

TECHNICAL FIELD

The present disclosure relates to a complementary resistance switchable filler and a nonvolatile complementary resistance switchable memory containing the same, more particularly to a complementary resistance switchable filler which allows for preparation of a complementary resistance switchable memory with transparency and flexibility without introducing a multi-layer structure by interposing an insulating layer paste in which the complementary resistance switchable filler of a core-shell structure is dispersed between electrodes and a nonvolatile complementary resistance switchable memory containing the same.

BACKGROUND

The semiconductor-related industry currently typified by DRAM and flash memory has developed successfully through miniaturization and integration based on the fact that the principles of operation can be maintained even when the size of the devices is decreased. However, with the recent rapid development of the information and communications technology, the performance and complexity of the devices are increasing and high speed, high integration and power saving are required for the memory devices. But, the DRAM is problematic in that it is volatile and is limited in data processing speed. And, the flash memory has the problem that it requires a high threshold voltage (>5 V) in addition to the problems of increased complexity after the sub-30 nm process, electrical degradation and slow operation speed. Accordingly, development of next-generation memory devices overcoming the problems of the existing memory devices is necessary.

As next-generation nonvolatile memory devices for solving these problems, phase-change RAM, magnetic RAM (MRAM), resistance switchable RAM (RRAM), etc. are available. Among these next-generation memory devices, the RRAM records the data 1 and 0 as low resistance state (LRS) and high resistance state (HRS) are switched reversibly depending on the applied voltage conditions. In addition, the RRAM is the most promising candidate for commercialization because it can satisfy the data nonvolatility of flash memory, the fast operation speed of SRAM and, above all, the low power consumption of DRAM. In particular, it is drawing a lot of attentions because high integration density can be achieved through a simple 3-dimensional vertical crossbar array structure including a resistance switching layer made of an oxide thin film between top and bottom electrodes.

However, parasitic current resulting from interference between adjacent non-target cells of low resistance state located on the same bit line or word line in the crossbar array is known as the biggest problem in reliable operation of the RRAM. Sneak current passing through the cells located on the same row or column as the target cell may result in errors when reading and recording cell state. For example, sneak current through adjacent non-target cells may cause errors in reading by affecting the total current of the target cell.

The one-transistor one-resistor (1T1R) structure proposed to solve the problem caused by the parasitic current has superior selectivity but the memory integration density is significantly limited. The 1S1R structure using one selector and one resistor, which was proposed as another solution, makes the structure of the crossbar array complicated. In addition, the nonlinear element of the selector is significantly dependent on the array size and enough current may not pass to the target cell.

Accordingly, a complementary resistance switchable (CRS) random access memory which exhibits memory function and selectivity at the same was proposed recently. The CRS memory has an insulator/conductor/insulator structure between top and bottom electrodes as if two resistance switchable memories face each other. The CRS memory records "0" when the top element is in high resistance state and the bottom element is in low resistance state. On the contrary, it records "1" when the top element is in low resistance state and the bottom element is in high resistance state. Because the entire device is in high resistance state whether "0" or "1" is recorded, sneak current resulting from the interference of adjacent non-target cells is excluded. In addition, because it exhibits self-compliance current behavior not requiring an external resistor for current compliance, it is not affected by RC delay.

However, because the CRS memory is driven based on the filamentary phenomena of formation and extinction of conductive filaments, it shows the problems occurring in the existing resistance switchable memory based on the filamentary phenomena, such as indefinite and random formation of many filaments. As a result, the CRS memory driven by the complementary behavior of two filaments may suffer from severe device instability (poor endurance/retention). In addition, the CRS memory is problematic in that it is difficult to ensure mechanical stability for a highly integrated crossbar array structure because a process of depositing multiple thin films is necessary for the resistance switchable memory and it is difficult to ensure physical properties required for wearable devices, such as transparency or bendability, due to the presence of multiple intermediate layers.

REFERENCES OF THE RELATED ART

Patent Documents

Korean Patent Publication No. 10-2016-0049574.
Korean Patent Publication No. 10-1416243.

SUMMARY

The present disclosure is directed to providing a resistance-switchable material capable of exhibiting complementary resistive switching characteristics with improved reliability and stability as symmetrical uniform filament current paths are formed in respective resistive layers adjacent to two electrodes with a conductive core of a complementary resistance-switchable filler at the center due to the electric field control effect by the spherical complementary resistance-switchable filler and a nonvolatile complementary resistance switchable memory containing the same.

The present disclosure is also directed to providing a nonvolatile complementary resistance switchable memory which can achieve selectivity without an additional selector element and allow for a highly integrated 3-dimensional crossbar array as the spherical resistance-switchable filler is prepared into a nanometer scale.

The present disclosure is also directed to providing a complementary resistance switchable memory which does not have the layered structure of a top electrode, a first resistive layer, a conductive layer, a second resistive layer and a bottom electrode of the typical complementary resistance switchable memory. Because a first resistive layer, a conductive layer and a second resistive layer are formed as one layer and bipolar conductive filaments are formed on the substantially different resistive layers, the memory can exhibit complementary resistive switching characteristics and read margin can be increased sufficiently by maintaining the on state sufficiently after the set operation and then conducting the reset operation. In addition, transparency and flexibility can be improved by reducing the number of layers.

The present disclosure is also directed to providing a simplified and inexpensive process of preparing a complementary resistance switchable memory by coating a paste in which a complementary resistance switchable filler and a supporting material are mixed.

In an aspect, the present disclosure provides a resistance-switchable material containing: an insulating support; and a complementary resistance switchable filler dispersed in the insulating support, wherein the complementary resistance switchable filler has a spherical core-shell structure containing: a spherical conductive core containing a conductive material; and an insulating shell formed on the surface of the core and containing an insulating material.

The spherical conductive core may contain one or more selected from a spherical carbon particle, a spherical gold particle, a spherical platinum particle, a spherical silver particle and a spherical copper particle.

The spherical conductive core may have a diameter of 20-100 nm.

The insulating shell may have a thickness of 10-50 nm.

The insulating shell may contain one or more selected from NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$ and $Ag_3SI$.

The insulating support may contain one or more selected from an acrylic resin, a urethane-based resin, an epoxy-based resin, a polyester-based resin, a phenol-based resin, polyvinyl chloride, polyacetal and polyvinyl alcohol.

In another aspect, the present disclosure provides a nonvolatile complementary resistance switchable memory containing: a substrate; a bottom electrode disposed on the substrate; a resistance-switchable material disposed on the bottom electrode; and a top electrode disposed on the resistance-switchable material, wherein the resistance-switchable material contains: an insulating support; and a complementary resistance switchable filler dispersed in the insulating support, the complementary resistance switchable filler has a spherical core-shell structure containing: a spherical conductive core containing a conductive material; and an insulating shell formed on the surface of the core and containing an insulating material, and the bottom electrode and the top electrode respectively form two different resistive layers by contacting different surfaces of the complementary resistance switchable filler.

Symmetric electric fields may be formed on the two resistive layers.

The symmetric electric fields may be generated by filament current paths formed on both sides of the spherical conductive core.

The filament current paths may be formed with symmetrical conical shapes.

The size of the filament current path may be controlled by one or more selected from the diameter of the spherical conductive core and the coating thickness of the insulating shell.

The size of the filament current path may be controlled by a compliance current set when the filament current path is formed first.

The bottom electrode or the top electrode may be made of one selected from a metal, a conductive carbon material and a conductive polymer material.

The metal may be one or more selected from Ag, Au, Cu, Ni, Cr, Pt, Pb, Ru, Pd, TiN, W, Co, Mn, Ti and Fe.

The conductive carbon material may be one or more selected from graphene, a carbon nanotube and a fullerene.

The conductive polymer material may be one or more selected from polypyrrole, polythiophene, poly(p-phenylene vinylene), polyaniline, polyacetylene and PEDOT:PSS (poly (3,4-ethylenedioxythiophene) polystyrene sulfonate).

In another aspect, the present disclosure provides a method for preparing a complementary resistance switchable filler, including: (1) a step of preparing a core dispersion by dispersing a spherical conductive core in a solvent; and (2) a step of coating an insulating layer on the surface of the spherical conductive core by adding a precursor of an insulating polymer to the core dispersion.

In another aspect, the present disclosure provides a method for preparing a nonvolatile complementary resistance switchable memory, including: (a) a step of preparing a paste containing the resistance-switchable material described above; (b) a step of forming a bottom electrode on a substrate; (c) a step of forming a resistance-switchable material layer by coating the paste on the bottom electrode and then curing the same; and (d) a step of forming a top electrode on the resistance-switchable material layer.

Specifically, the step (a) may include: (a-1) a step of preparing a complementary resistance switchable filler of a core-shell structure by coating an insulating material on the surface of a spherical conductive nanoparticle; and (a-2) a step of preparing the paste by mixing the complementary resistance switchable filler with an insulating supporting material.

In the step (a-1), the insulating material may be coated by dispersing the spherical conductive nanoparticle in a solvent and then adding a precursor of the insulating material.

In the step (b) or (d), the bottom electrode or the top electrode may be formed by a method selected from sputtering, chemical vapor deposition, atomic layer deposition, pulsed laser deposition, molecular beam epitaxy, vacuum thermal deposition and vacuum electron beam deposition.

In the step (c), the paste may be coated by a method selected from spin coating, blade casting and inkjet printing.

The present disclosure is directed to providing a resistance-switchable material and a nonvolatile complementary resistance switchable memory containing the same, which can exhibit complementary resistive switching characteristics with improved reliability and stability as symmetrical uniform filament current paths are formed in respective resistive layers adjacent to two electrodes with a conductive core of a complementary resistance-switchable filler at the center due to the electric field control effect by the spherical complementary resistance-switchable filler and a nonvolatile complementary resistance switchable memory containing the same.

The present disclosure is also directed to providing a nonvolatile complementary resistance switchable memory which can achieve selectivity without an additional selector element and allow for a highly integrated 3-dimensional crossbar array as the spherical resistance-switchable filler is prepared into a nanometer scale.

The present disclosure is also directed to providing a complementary resistance switchable memory which does not have the layered structure of a top electrode, a first resistive layer, a conductive layer, a second resistive layer and a bottom electrode of the typical complementary resistance switchable memory. Because a first resistive layer, a conductive layer and a second resistive layer are formed as one layer and bipolar conductive filaments are formed on the substantially different resistive layers, the memory can exhibit complementary resistive switching characteristics and read margin can be increased sufficiently by maintaining the on state sufficiently after the set operation and then conducting the reset operation. In addition, transparency and flexibility can be improved by reducing the number of layers.

The present disclosure is also directed to providing a simplified and inexpensive process of preparing a complementary resistance switchable memory by coating a paste in which a complementary resistance switchable filler and a supporting material are mixed.

BRIEF DESCRIPTION OF DRAWINGS

FIG. 6 shows electric fields formed in two resistive layers of a memory prepared in Comparative Example 1.

DETAILED DESCRIPTION OF EMBODIMENTS

Figure 1:
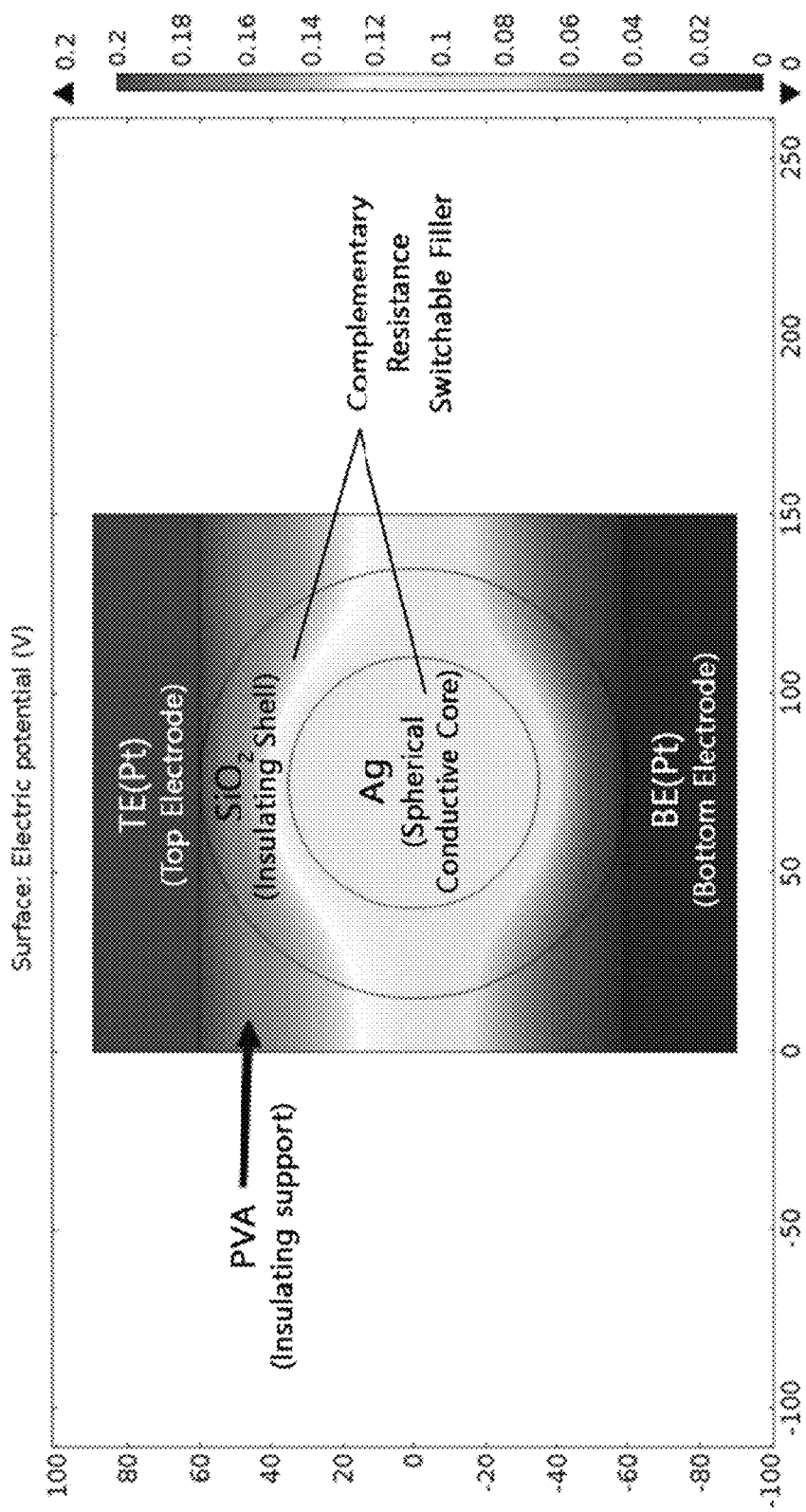
FIG. 1 shows the voltage distribution of a nonvolatile complementary resistance switchable memory according to the present disclosure prepared in Example 1.

Hereinafter, various aspects and exemplary embodiments of the present disclosure are described in more detail.

Hereinafter, the exemplary embodiments of the present disclosure are described in more detail referring to the attached drawings so that those of ordinary skill in the art to which the present disclosure belongs can easily carry out the present disclosure.

However, the following description is not intended to limit the present disclosure to specific exemplary embodiments and description of well-known techniques is omitted to avoid unnecessarily obscuring the present disclosure.

The terms used in the present disclosure are intended to describe specific exemplary embodiments, not to limit the present disclosure. Singular expressions include plural expressions unless they have definitely opposite meanings in the context. In the present disclosure, the terms "contain", "include", "have", etc. indicate that a feature, a number, a step, an operation, an element or a combination thereof described in the specification is present, but does not preclude the possibility of presence or addition of one or more other features, numbers, steps, operations, elements or combinations thereof.

Hereinafter, a resistance-switchable material of the present disclosure is described in detail.

The resistance-switchable material of the present disclosure may contain: an insulating support; and a complementary resistance switchable filler dispersed in the insulating support.

The complementary resistance switchable filler may have a spherical core-shell structure containing: a spherical conductive core containing a conductive material; and an insulating shell formed on the surface of the core and containing an insulating material.

The spherical conductive core may contain a spherical carbon particle, a spherical gold particle, a spherical platinum particle, a spherical silver particle, a spherical copper particle, etc.

The spherical conductive core may have a diameter of specifically 20-100 nm, more specifically 20-40 nm.

The insulating shell may contain NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc.

The insulating shell coated on the spherical conductive core may have a thickness of specifically 10-50 nm, more specifically 10-20 nm.

The insulating support may contain an acrylic resin, a urethane-based resin, an epoxy-based resin, a polyester-based resin, a phenol-based resin, polyvinyl chloride, polyacetal, polyvinyl alcohol, etc.

Hereinafter, a nonvolatile complementary resistance switchable memory of the present disclosure is described in detail.

The nonvolatile complementary resistance switchable memory of the present disclosure may have a structure in which a substrate, a bottom electrode, a resistance-switchable material and a top electrode are stacked sequentially.

The resistance-switchable material may contain: an insulating support; and a complementary resistance switchable filler dispersed in the insulating support, and the complementary resistance switchable filler may have a spherical core-shell structure containing: a spherical conductive core containing a conductive material; and an insulating shell formed on the surface of the core and containing an insulating material.

The substrate may be glass, a silicon wafer, a metal foil, etc.

The conductive material contained in the spherical conductive core may be a spherical carbon particle, a spherical gold particle, a spherical platinum particle, a spherical silver particle, a spherical copper particle, etc.

The insulating material contained in the insulating shell may include NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc.

The top electrode is disposed on the resistance-switchable material.

The bottom electrode and the top electrode may respectively form two different resistive layers by contacting different surfaces of the complementary resistance switchable filler.

Symmetric electric fields may be formed on the two resistive layers. The symmetric electric fields may be generated by filament current paths formed on both sides of the spherical conductive core. The filament current paths may be formed with symmetrical conical shapes.

The spherical conductive core contained in the complementary resistance switchable filler may have a diameter of specifically 20-100 nm, more specifically 20-40 nm, and the insulating shell coated on the spherical conductive core may have a thickness of specifically 10-50 nm, more specifically 10-20 nm. However, the scope of the present disclosure is not limited thereto.

The size of the filament current path may be controlled by controlling the diameter of the spherical conductive core or the coating thickness of the insulating shell.

The size of the filament current path may also be controlled by a compliance current set when the filament current path is formed first.

The bottom electrode or the top electrode may be made of a metal, a conductive carbon material or a conductive polymer material.

The metal may be Ag, Au, Cu, Ni, Cr, Pt, Pb, Ru, Pd, TiN, W, Co, Mn, Ti, Fe, etc.

The conductive carbon material may be graphene, a carbon nanotube, a fullerene, etc.

The conductive polymer material may be polypyrrole, polythiophene, poly(p-phenylene vinylene), polyaniline, polyacetylene, PEDOT:PSS (poly(3,4-ethylenedioxythiophene) polystyrene sulfonate), etc.

Hereinafter, a method for preparing a complementary resistance switchable filler of the present disclosure is described.

First, a core dispersion is prepared by dispersing a spherical conductive core in a solvent (step 1).

Reference can be made to the foregoing description for details about the spherical conductive core.

Specifically, the solvent may be an alcohol solvent.

Next, an insulating layer is coated on the surface of the spherical conductive core by adding a precursor of an insulating polymer to the core dispersion (step 2).

The precursor of the insulating material may be tetraethoxysilane (TEOS), tetramethyl orthosilicate (TMOS), titanium tetrachloride ($TiCl_4$), titanium(IV) propoxide (Ti(OH)$_4$), aluminum sulfate ($Al_2(SO_4)_3$), zinc nitrate ($Zn(NO_3)_2$), zirconium nitrate ($Zr(NO_3)_4$), silver nitrate ($AgNO_3$), etc.

As a result of the reaction, an insulating material such as NiO, $SiO_2$, $TiO_2$, ZnO, $HfO_2$, $Nb_2O_5$, MgO, $Al_2O_3$, $Ta_2O_5$, $La_2O$, $Cu_2O$, $ZrO_2$, $Fe_2O_3$, $SrTiO_3$, Cr-doped $SrZrO_3$, $Pr_{0.7}Ca_{0.3}MnO_3$, $Ag_2S$, $Ag_2Se$, CuS, AgI, $Ag_2Te$, $Ag_2HgI_4$, $Ag_3SI$, etc. may be coated on the surface of the spherical conductive material.

Hereinafter, a method for preparing a complementary resistance switchable memory of the present disclosure is described.

First, a paste containing the resistance-switchable material of the present disclosure is prepared (step a).

A complementary resistance switchable filler of a core-shell structure is prepared by coating an insulating material on the surface of a spherical conductive nanoparticle (step a-1).

The insulating material may be coated by dispersing the spherical conductive nanoparticle in a solvent and then adding the precursor of the insulating material.

The spherical conductive nanoparticle may be a spherical carbon particle, a spherical gold particle, a spherical platinum particle, a spherical silver particle, a spherical copper particle, etc.

Reference can be made to the foregoing description about the method for preparing a complementary resistance switchable filler for details about the precursor of the insulating material.

As a result of the reaction, the insulating material may be coated on the surface of the spherical conductive material, and reference can be made to the foregoing description about the method for preparing a complementary resistance switchable filler for details about the insulating material.

Next, a paste is prepared by mixing the complementary resistance switchable filler with an insulating supporting material (step a-2).

The insulating supporting material may be an acrylic resin, a urethane-based resin, an epoxy-based resin, a polyester-based resin, a phenol-based resin, polyvinyl chloride, polyacetal, polyvinyl alcohol, etc.

Then, a bottom electrode is formed on a substrate (step b).

The bottom electrode may be formed by sputtering, chemical vapor deposition, atomic layer deposition, pulsed laser deposition, molecular beam epitaxy, vacuum thermal deposition, vacuum electron beam deposition, etc.

The bottom electrode may be made of a metal, a conductive carbon material, a conductive polymer material, etc. and reference can be made to the foregoing description for details.

Next, a resistance-switchable material layer is formed by coating the paste on the bottom electrode and then curing the same (step c).

The paste may be coated by spin coating, blade casting, inkjet printing, etc., although the scope of the present disclosure is not limited thereto.

The curing may be performed by thermal curing or photocuring. Specifically, it may be performed by thermal curing.

Finally, a top electrode is formed on the resistance-switchable material layer (step d).

The top electrode may be formed by sputtering, chemical vapor deposition, atomic layer deposition, pulsed laser deposition, molecular beam epitaxy, vacuum thermal deposition, vacuum electron beam deposition, etc.

The top electrode may be made of a metal, a conductive carbon material, a conductive polymer material, etc. and reference can be made to the foregoing description for details.

Hereinafter, the present disclosure is described in more detail through examples.

EXAMPLES

Example 1

(1) Preparation of Silver Nanopowder

A silver nanopowder (AgNP) with a diameter of 45 nm was prepared. First, 30 g of an aqueous solution was prepared by dissolving 0.151 g of polyvinylpyrrolidone ($M_w$: 55000, Sigma Aldrich), 0.048 g of trisodium citrate (Sigma Aldrich) and glucose (Daejung Chemicals & Metals) in 29.719 g of water. After heating to 100° C., a solution prepared by mixing 0.027 g of silver nitrate (Sigma Aldrich) and 0.5 g of ammonium hydroxide (1 mol/L, Junsei) in 5 g of water was added at a constant speed for 10 minutes, a total of 3 times over 30 minutes. A silver nanopowder was prepared by terminating the reaction when the color of the solution turned jade green.

(2) Preparation of Paste

A complementary resistance-switchable filler was prepared by coating $SiO_2$ on the surface of the Ag nanopowder (diameter: 45 nm). First, after dispersing the prepared AgNP in 40 mL of an ethanol solvent, a $SiO_2$ insulating shell was formed on the surface of the AgNP by adding 0.2 g of TEOS (tetraethyl orthosilicate, Sigma Aldrich) and 2 mL of ammonium hydroxide (28%, Junsei) and performing reaction at 40° C. for 2 hours. The coating thickness of $SiO_2$ was set to 17 nm by controlling the reaction temperature and the amount of TEOS. Then, a paste was prepared by mixing 10 mg of the prepared complementary resistance-switchable filler ($SiO_2$@AgNP) with 1 g of PVA ($M_w$: 85000-124000, Sigma Aldrich) and 9 g of water.

(3) Preparation of Nonvolatile Complementary Resistance Switchable Memory

A resistance-switchable material layer was formed by spin-coating the paste on a $Pt/TiO_2/SiO_2/Si$ bottom substrate having a bottom electrode formed and then curing the same at 70° C. for 24 hours. A patterned Ag top electrode was formed on the resistance-switchable material layer by thermal deposition using a mask.

Comparative Example 1

A nonvolatile complementary resistance switchable memory was prepared in the same manner as in Example 1 except that a silver nanowire (average particle diameter: 100 nm) was used instead of the silver nanopowder.

TEST EXAMPLES

Test Example 1: Analysis of Electric Field Distribution of Memory

Figure 2:
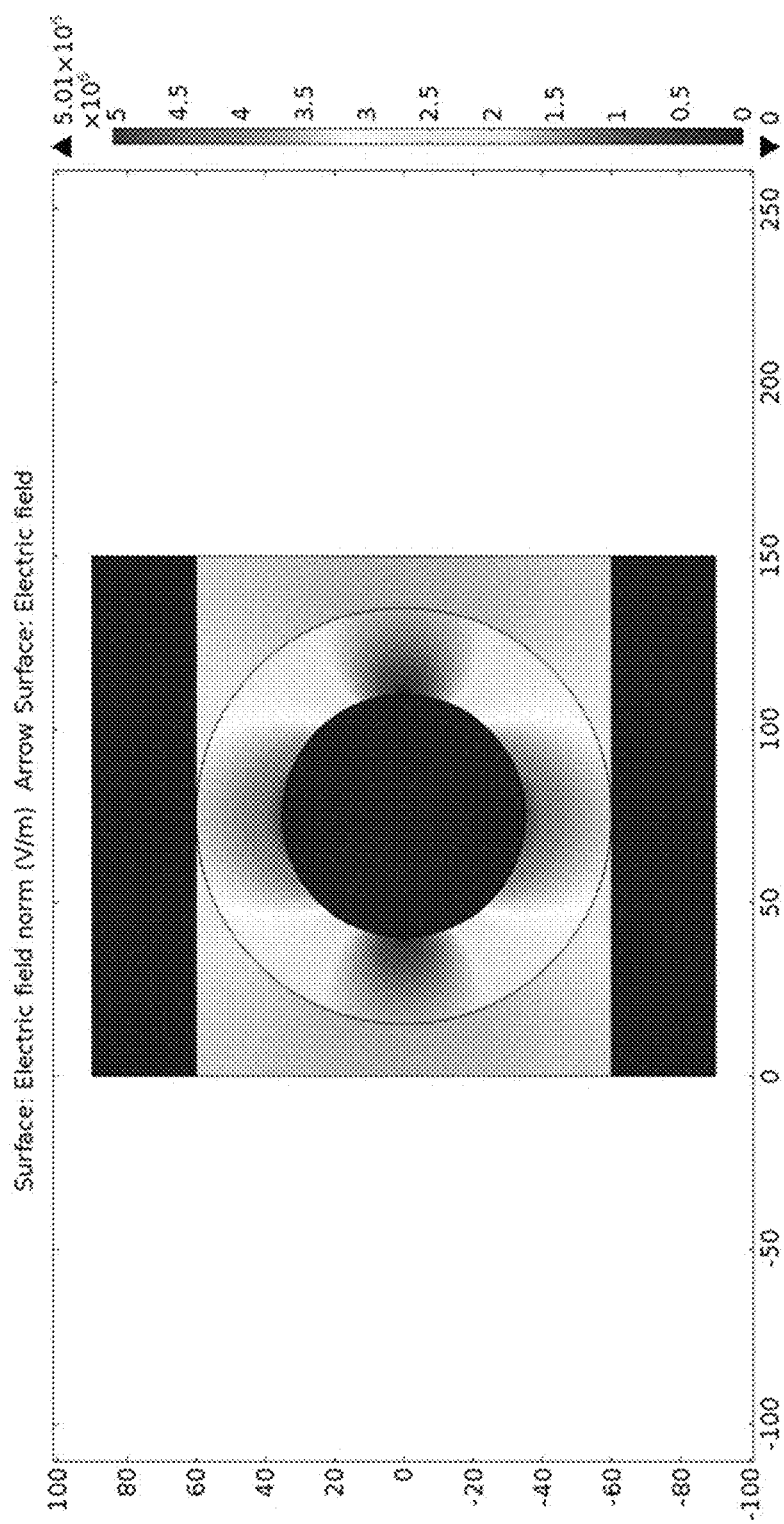
FIG. 2 shows the electric field distribution of a nonvolatile complementary resistance switchable memory according to the present disclosure prepared in Example 1.
Figure 3:
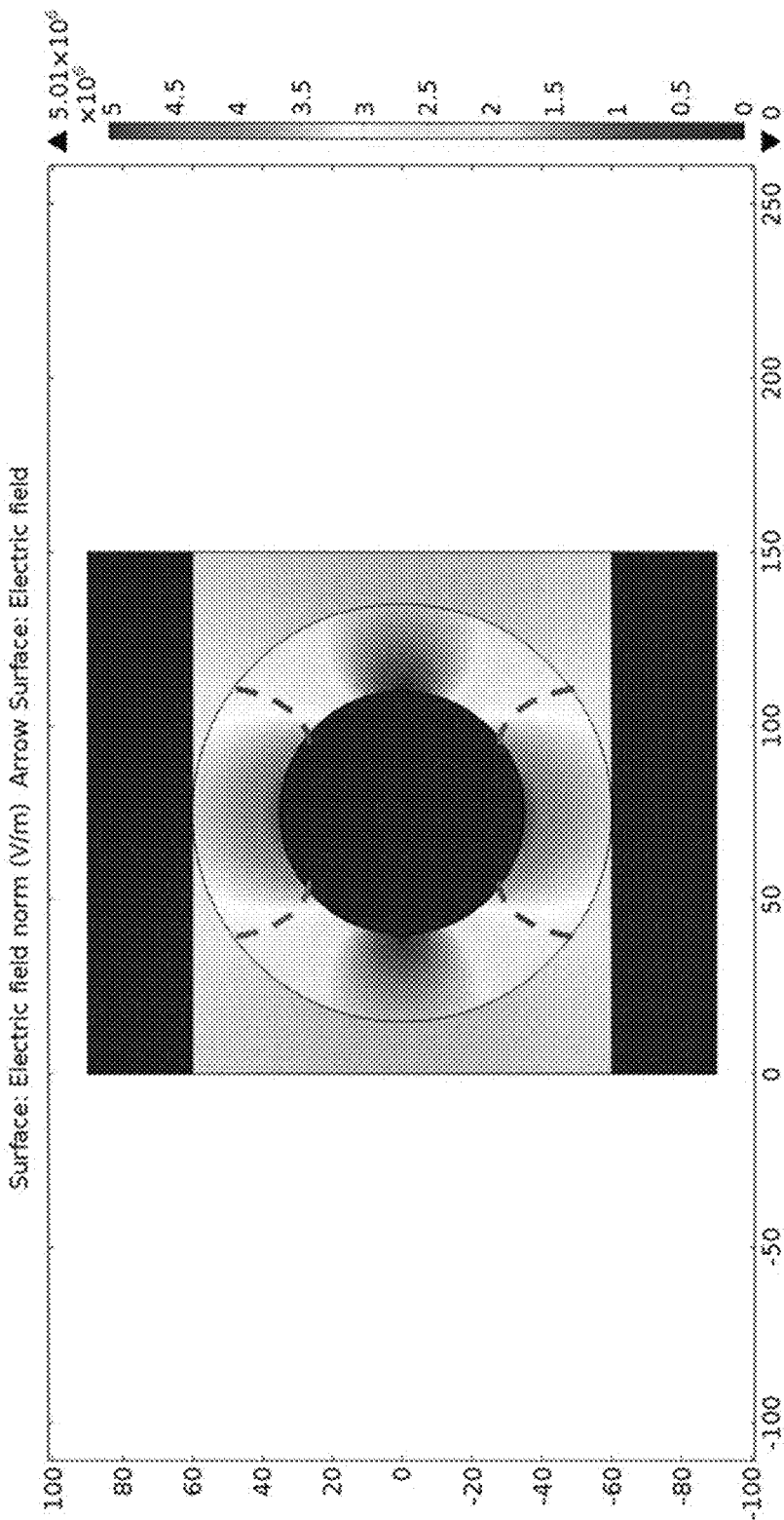
FIG. 3 shows a filament current path formed in a nonvolatile complementary resistance switchable memory according to the present disclosure prepared in Example 1.

The voltage distribution, electric field distribution and filament current path formation of the nonvolatile complementary resistance switchable memory according to the present disclosure prepared in Example 1 are shown in FIGS. 1-3, respectively.

From FIGS. 1-3, it can be seen that resistance switching layers were formed on two parts of the insulating shell of the complementary resistance switchable filler contacting the top electrode or the bottom electrode, symmetric electric fields were formed and a strong electric field was formed around the conductive core.

The nonvolatile complementary resistance switchable memory of Example 1 has a structure in which the two resistance switching layers are surrounded by the insulating support. Because the electric field is oriented toward the conductive core, only two filaments are formed per memory. Therefore, stable operation is possible despite repeated resistance switching. In addition, the reliability of the memory can be ensured because the operation voltage and current ranges are constant during the cell-to-cell operation.

Test Example 2: Physical Properties of Complementary Resistance Switchable Memory FIG. 4 is an image showing the shape and flexibility of the complementary resistance switchable memory prepared in Example 1 and FIG. 5 shows images showing the transparency of the complementary resistance switchable memory layer prepared in Example 1.

Figure 4:
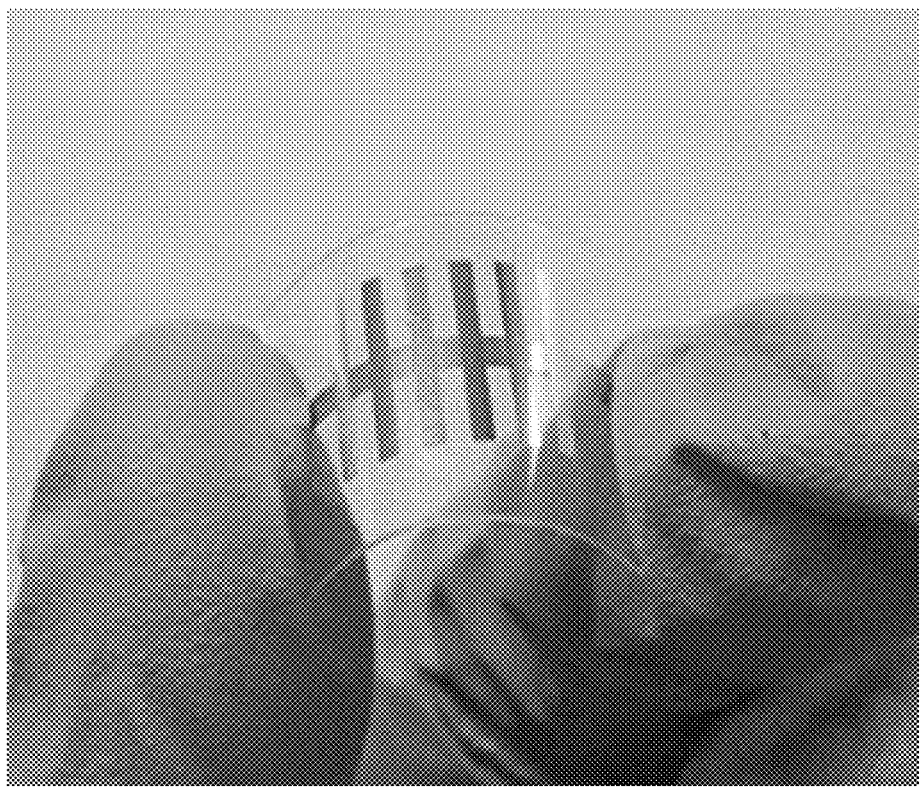
FIG. 4 is an image showing the shape and flexibility of complementary resistance switchable memory prepared in Example 1.
Figure 5:
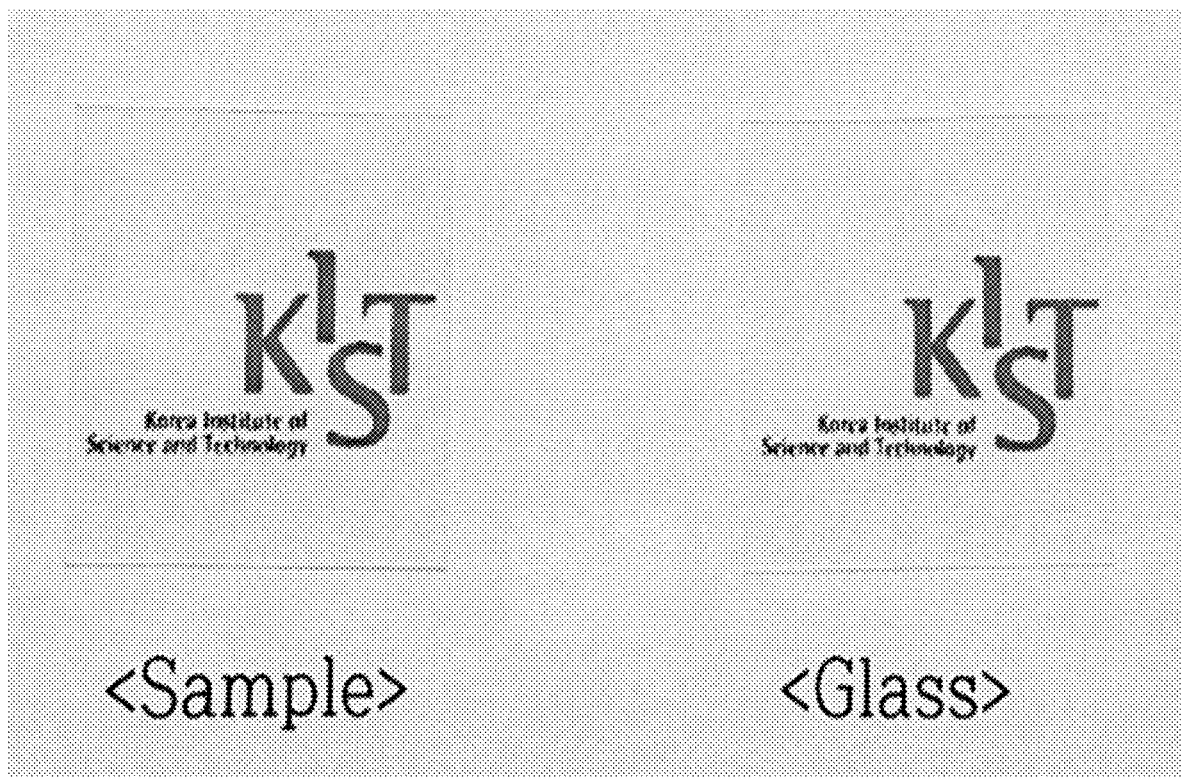
FIG. 5 shows images of a complementary resistance switchable memory layer prepared in Example 1.
Figure 9:
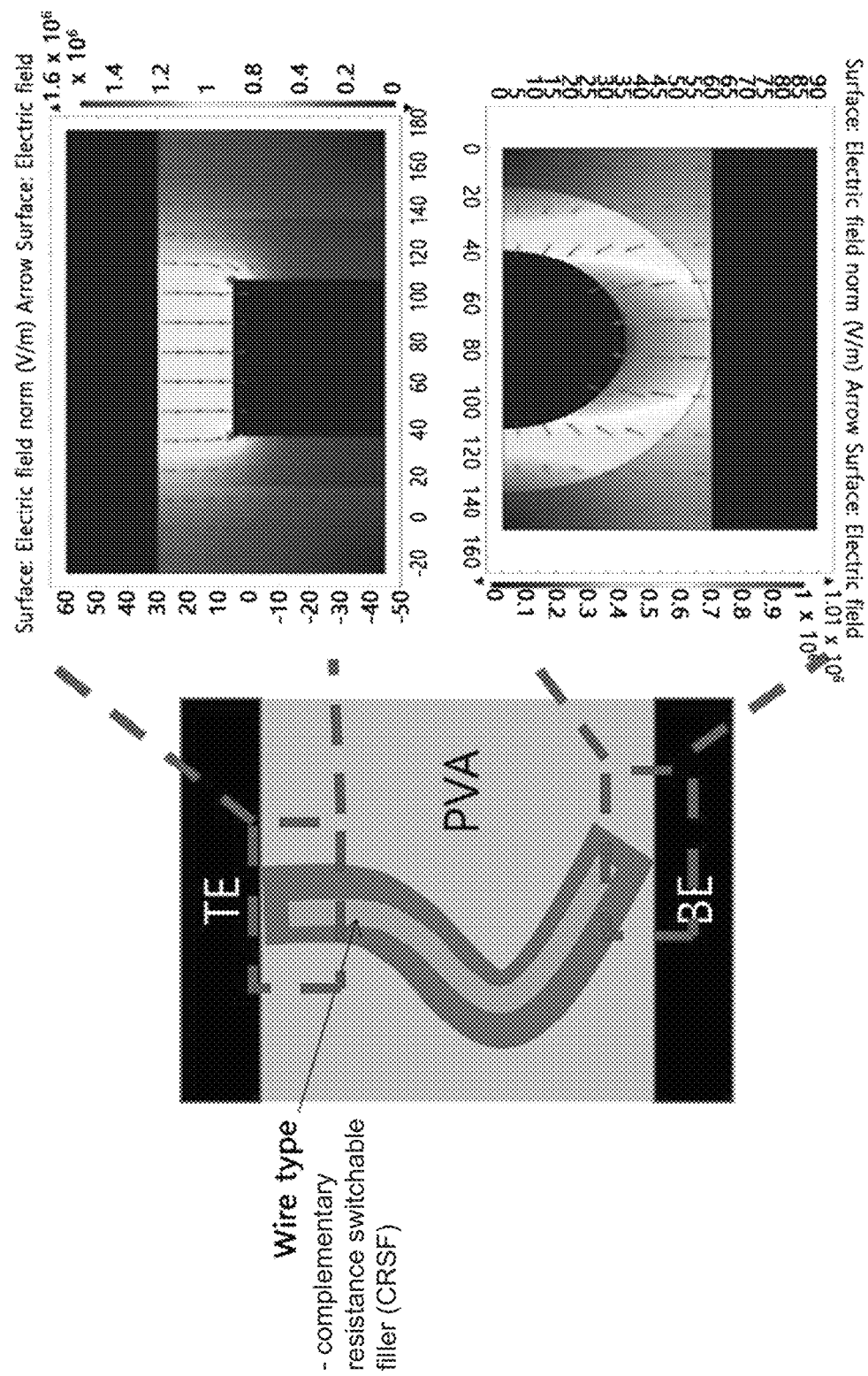

From FIG. 4 and FIG. 5, it can be seen that the memory device of Example 1 is bendable and transparent.

Test Example 3

FIG. 6 shows electric fields formed from unsymmetrical contact with the electrode for the nanowire-based complementary resistance switchable memory prepared in Comparative Example 1. From FIG. 6, it can be seen that unsymmetrical electric fields may be formed in two resistive layers of the memory of Comparative Example 1, unlike the memory of Example 1.

While the present disclosure has been described with respect to the specific embodiments, it will be apparent to those skilled in the art that various changes and modifications may be made without departing from the spirit and scope of the disclosure as defined in the following claims.

What is claimed is:

1. A method for preparing a nonvolatile complementary resistance switchable memory, comprising:
   (a) preparing a paste comprising a resistance-switchable material;
   (b) forming a bottom electrode on a substrate;
   (c) forming a resistance-switchable material layer by coating the paste on the bottom electrode and then curing the same; and
   (d) forming a top electrode on the resistance-switchable material layer,
   wherein the resistance-switchable material comprises an insulating support and a complimentary resistance switchable filler dispersed in the insulating support,
   wherein the complementary resistance switchable filler has a spherical core-shell structure prepared by:
       preparing a core dispersion by dispersing a spherical conductive core in a solvent, the spherical conductive core having a diameter of 20-100 nm; and
       coating an insulating layer on a surface of the spherical conductive core by adding a precursor of an insulating polymer to the core dispersion so that an insulating shell is formed on the surface of the spherical conductive core, the insulating shell having a thickness of 10-50 nm,
   wherein the bottom electrode and the top electrode are respectively form two different resistive layers by contacting different surfaces of the complementary resistance switchable filler, and
   wherein symmetric electric fields are generated by a filament current path formed on both sides of the spherical conductive core, a size of the filament current path being controlled by the diameter of the spherical conductive core and the thickness of the insulating shell.

2. The method for preparing the nonvolatile complementary resistance switchable memory according to claim 1, wherein the paste is prepared by mixing the complementary resistance switchable filler with the insulating support.

* * * * *